United States Patent
Takahashi et al.

(10) Patent No.: US 10,718,795 B2
(45) Date of Patent: Jul. 21, 2020

(54) DETECTING DEVICE

(71) Applicant: FANUC CORPORATION, Yamanashi (JP)

(72) Inventors: Shougo Takahashi, Yamanashi-ken (JP); Yuuki Fukumoto, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 75 days.

(21) Appl. No.: 16/108,703

(22) Filed: Aug. 22, 2018

(65) Prior Publication Data

US 2019/0064227 A1 Feb. 28, 2019

(30) Foreign Application Priority Data

Aug. 28, 2017 (JP) ................. 2017-163596

(51) Int. Cl.
*G01R 17/10* (2006.01)
*G01D 3/036* (2006.01)
(Continued)

(52) U.S. Cl.
CPC ............ *G01R 17/105* (2013.01); *G01B 7/18* (2013.01); *G01D 3/036* (2013.01); *G01K 1/20* (2013.01); *G01L 1/225* (2013.01)

(58) Field of Classification Search
None
See application file for complete search history.

(56) References Cited

U.S. PATENT DOCUMENTS 4,261,195 A * 4/1981 Lockery ............... G01L 1/2268
177/211
4,911,016 A * 3/1990 Miyazaki ............. G01L 1/2281
73/766
(Continued)

FOREIGN PATENT DOCUMENTS

CN 1089352 A 7/1994
JP S55118109 U 8/1980
(Continued)

OTHER PUBLICATIONS

English translation of Office Action issued by the Japanese Patent Office in relation to Japanese Application No. 2017-163596 dated Apr. 9, 2019. (8 pages).

(Continued)

*Primary Examiner* — Jas A Sanghera
(74) *Attorney, Agent, or Firm* — Robert P. Michal, Esq.; Carter, DeLuca & Farrell LLP (57) ABSTRACT

A detecting device includes: a bridge circuit having at least one sensing resistor whose resistance varies according to a physical quantity of a measurement object; a power supply configured to apply a voltage to the bridge circuit; an instrumentation amplifier configured to receive an output voltage of the bridge circuit from high-impedance input terminals, amplify the received output voltage, and output the amplified output voltage; and a physical quantity calculating unit configured to receive the output voltage amplified by the instrumentation amplifier and calculate the physical quantity based on the output voltage. The bridge circuit is connected to the instrumentation amplifier via a connector.

8 Claims, 8 Drawing Sheets

(51) Int. Cl.
*G01B 7/16* (2006.01)
*G01K 1/20* (2006.01)
*G01L 1/22* (2006.01)

(56) References Cited

U.S. PATENT DOCUMENTS

| | | | |
|---|---|---|---|
| 7,293,466 B2* | 11/2007 | Ohta | F16B 31/02 |
| | | | 257/417 |
| 2006/0207339 A1* | 9/2006 | Sumigawa | G01B 7/18 |
| | | | 73/777 |
| 2008/0134797 A1* | 6/2008 | Nakano | B60N 2/002 |
| | | | 73/781 |
| 2015/0016487 A1 | 1/2015 | Britton et al. | |

FOREIGN PATENT DOCUMENTS

| | | | |
|---|---|---|---|
| JP | H07301555 A | 11/1995 | |
| JP | 11-211544 A | 8/1999 | |
| JP | 2004109114 A | 4/2004 | |
| JP | 2008064497 A | 3/2008 | |
| JP | 2008-134229 A | 6/2008 | |
| JP | 2014215260 A | 11/2014 | |
| JP | 2015-505060 A | 2/2015 | |
| JP | 2015530579 A | 10/2015 | |
| JP | 2017163596 A | 9/2017 | |
| WO | 2008029520 A1 | 3/2008 | |

OTHER PUBLICATIONS

Hirakawa Mitsunori, Easy understanding of OP-amplifier circuits pp. 4-11, published Dec. 20, 1995 (6 pages) *Explanation listed in English machine translation of Office Action dated Apr. 9, 2019.

* cited by examiner

| L1 | |
|---|---|
| L2-1 | L2-2 |
| L3 | |

DETECTING DEVICE

CROSS-REFERENCE TO RELATED APPLICATION

This application is based upon and claims the benefit of priority from Japanese Patent Application No. 2017-163596 filed on Aug. 28, 2017, the contents of which are incorporated herein by reference.

BACKGROUND OF THE INVENTION

Field of the Invention

The present invention relates to a detecting device including a bridge circuit of a plurality of resistors including at least one sensing resistor whose resistance varies according to a physical quantity of an object to be measured.

Description of the Related Art

Japanese Laid-Open Patent Publication No. 11-211544 discloses a configuration in which strain gauge resistors provided on a strain generating body of a load cell are connected to a printed circuit board by lead wires.

SUMMARY OF THE INVENTION

In the technique of Japanese Laid-Open Patent Publication No. 11-211544, it is necessary to solder the lead wires extending from the strain gauge resistors, to the printed circuit board. However, such soldering takes time and labor. In order to solve the trouble of soldering, it is conceivable to connect the strain gauge resistors and the printed circuit board by using connectors. However, the presence of the contact resistance of the connectors in the Wheatstone bridge formed of the strain gauge resistors affects the output voltage from the Wheatstone bridge, so that there is a possibility that an accurate output voltage cannot be obtained.

The present invention has been devised to solve the above problem, and it is therefore an object of the present invention to provide a detecting device capable of accurately detecting the output voltage of a bridge circuit.

According to an aspect of the present invention, there is provided a detecting device including: a bridge circuit having a plurality of resistors including at least one sensing resistor whose resistance varies according to a physical quantity of a measurement object; a power supply configured to apply a voltage to the bridge circuit; an amplifier having high-impedance input terminals and configured to receive an output voltage of the bridge circuit from the input terminals, amplify the received output voltage and output the amplified output voltage; a physical quantity calculating unit configured to receive the output voltage amplified by the amplifier and calculate the physical quantity based on the output voltage; a first substrate on which the bridge circuit is provided; and a second substrate on which the amplifier is provided, wherein the bridge circuit is connected to the amplifier via a connector.

According to the present invention, it is possible to accurately detect the output voltage of the bridge circuit.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

First Embodiment

[Configuration of Detecting Device]

Figure 1:
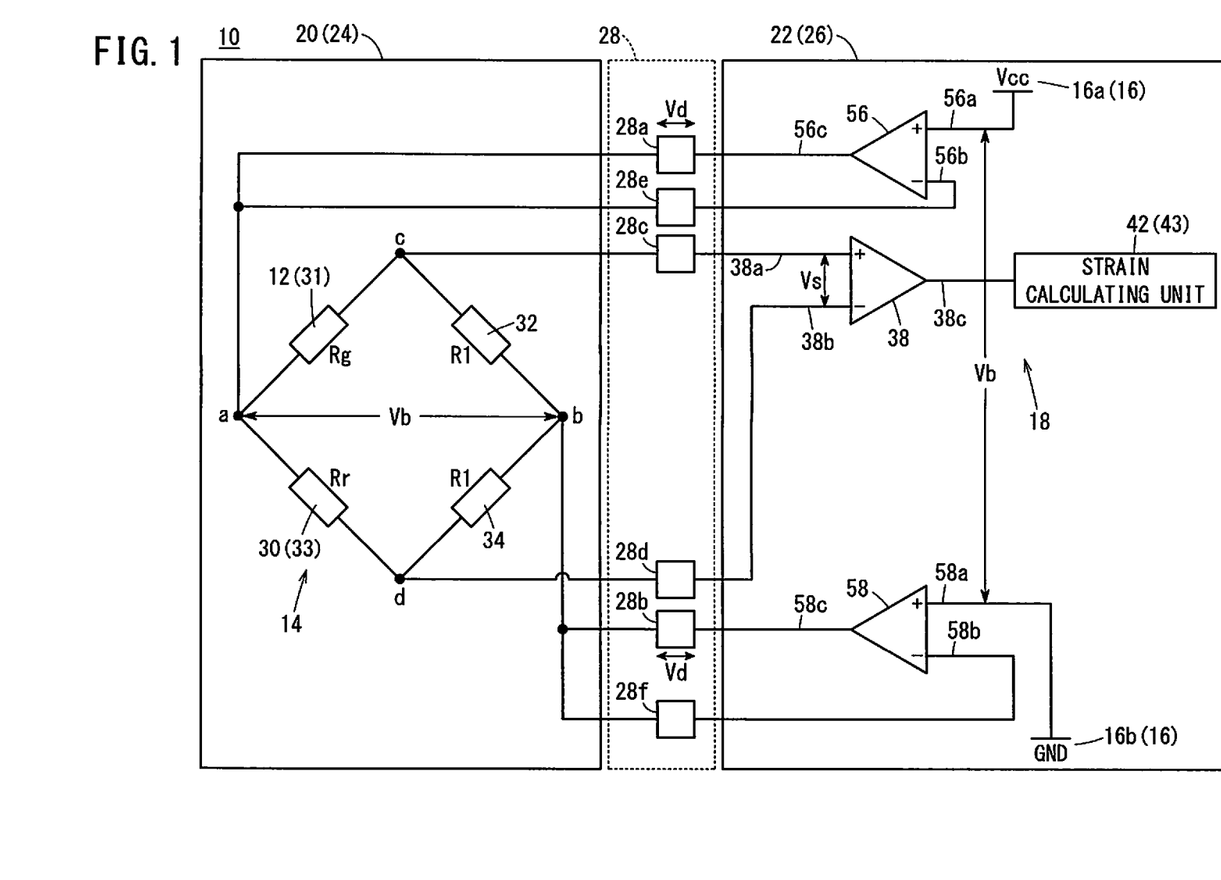
FIG. 1 is a diagram showing a circuit configuration of a detecting device according to an embodiment of the present invention.

FIG. 1 is a diagram showing a circuit configuration of a detecting device 10. The detecting device 10 of the present embodiment detects change in resistance of a strain gauge 12 stuck or applied to an object to be measured (measurement object) such as a strain generating body of a load cell, and calculates an amount of strain arising in the measurement object from the change in resistance. Based on the strain amount of the measurement object, a physical quantity to be measured, such as load, pressure, torque, tensile force, shear force, etc., acting on the measurement object can be determined. Here, instead of the strain gauge 12, a detecting element whose resistance changes depending on gas concentration may be used to detect gas concentration as a physical quantity to be measured.

The detecting device 10 includes a bridge circuit 14, a power supply 16 and a detection circuit 18. The bridge circuit 14 is provided on a flexible printed circuit board (hereinafter referred to as FPC) 20, and the power supply 16 and the detection circuit 18 are provided on a printed circuit board (hereinafter referred to as PCB) 22. The FPC 20 constitutes a first substrate 24, and the PCB 22 constitutes a second substrate 26. The FPC 20 and the PCB 22 are connected by a connector 28.

The bridge circuit 14 includes a strain gauge 12, a temperature compensation gauge 30, a resistor 32 and a resistor 34. The strain gauge 12 constitutes a sensing resistor 31, and the temperature compensation gauge 30 constitutes a reference resistor 33. The strain gauge 12 is stuck or applied to a place where deformation or strain occurs when a load acts on the measurement object. The temperature compensation gauge 30 is affixed to a place where no deformation occurs even if a load acts on the measurement object.

In the measurement object, deformation occurs due to a load acting on the measurement object, and also occurs depending on the ambient temperature. As the strain gauge 12 and the temperature compensation gauge 30 are attached to the aforementioned respective places, the strain gauge 12 changes its resistance depending on the load which is the measurement target physical quantity of the measurement object and also depending on the ambient temperature which is a physical quantity other than the measurement target, while the temperature compensation gauge 30 changes its resistance only in accordance with the ambient temperature which is the physical quantity other than the measurement target. The resistor 32 and the resistor 34 are fixed resistors.

The strain gauge 12 and the temperature compensation gauge 30 change their resistance depending on the amounts of strain of the measurement object. The bridge circuit 14 is adjusted so as to maintain a balanced state (output voltage=0) when strain is generated in the measurement object due to a change in ambient temperature with no load being applied to the measurement object. On the other hand, when strain occurs due to a load acting on the measurement object, the bridge circuit 14 loses balance (i.e., no longer maintains the balanced state) and generates an output voltage. It is possible to calculate the load acting on the measurement object from the magnitude of the output voltage.

The strain gauge 12 and the temperature compensation gauge 30 are connected at a contact point a, the resistor 32 and the resistor 34 are connected at a contact point b, the strain gauge 12 and the resistor 32 are connected at a contact point c, and the temperature compensation gauge 30 and the resistor 34 are connected at a contact point d. The strain gauge 12, the temperature compensation gauge 30, the resistor 32 and the resistor 34 are arranged at intervals that are equal to or less than a predetermined distance. As a result, the ambient temperatures of the strain gauge 12, the temperature compensation gauge 30, the resistor 32 and the resistor 34 are set to be substantially the same.

The power supply 16 is a DC (direct current) power source, and supplies a constant voltage (=Vb) to the bridge circuit 14. In the power supply 16, error amplifiers 56 and 58 are provided on a positive electrode 16a side and a negative electrode 16b side, respectively.

The error amplifier 56 is an operational amplifier, and has two high-impedance differential input terminals (input terminals 56a, 56b) and a low-impedance output terminal 56c. The error amplifier 56 amplifies the potential difference between the positive electrode 16a of the power supply 16 and the contact point a, input to the input terminals 56a and 56b, and outputs the amplified potential difference to the output terminal 56c. That is, the error amplifier 56 is used to constitute a power supply voltage feedback circuit.

The error amplifier 58 is an operational amplifier, and has two high-impedance differential input terminals (input terminals 58a, 58b) and a low-impedance output terminal 58c. The error amplifier 58 amplifies the potential difference between the negative electrode 16b of the power supply 16 and the contact point b, input to the input terminals 58a and 58b, and outputs the amplified potential difference to the output terminal 58c. That is, the error amplifier 58 is used to constitute a power supply voltage feedback circuit.

The detection circuit 18 has an instrumentation amplifier 38 and a strain calculating unit 42. The instrumentation amplifier 38 has two high-impedance differential input terminals (input terminals 38a and 38b) and a low-impedance output terminal 38c. The instrumentation amplifier 38 amplifies the potential difference between the contact point c and the contact point d, input to the input terminals 38a and 38b, and outputs the amplified potential difference to the output terminal 38c. The strain calculating unit 42 receives the potential difference amplified by the instrumentation amplifier 38, and calculates the amount of strain acting on the measurement object. The strain calculating unit 42 constitutes a physical quantity calculating unit 43.

The strain gauge 12 and the temperature compensation gauge 30 are connected at the contact point a to the output terminal 56c of the error amplifier 56. The contact point a and the output terminal 56c are connected via a connector 28a. The strain gauge 12 and the temperature compensation gauge 30 are connected at the contact point a to the negative input terminal 56b of the error amplifier 56. The contact point a and the input terminal 56b are connected via a connector 28e. The positive electrode 16a of the power supply 16 is connected to the positive input terminal 56a of the error amplifier 56.

Since a voltage drop (=Vd) occurs due to the resistance of the connector 28a, the voltage at the contact point a is lower than the voltage at the output terminal 56c. The error amplifier 56 uses the voltage at the positive electrode 16a as a reference voltage, and outputs, to the output terminal 56c, a voltage corresponding to the potential difference between the positive electrode 16a and the contact point a. Thereby, the contact point a is kept at the voltage Vb. Since the input terminal 56b of the error amplifier 56 has high impedance so that almost no current flows, the voltage drop at the connector 28e can be neglected.

The wiring between the output terminal 56c from the positive electrode 16a and the strain gauge 12 and the wiring between the output terminal 56c and the temperature compensation gauge 30 are formed so that the resistance between the output terminal 56c and the strain gauge 12 and the resistance between the output terminal 56c and the temperature compensation gauge 30 are equal to each other. Further, the wiring between the output terminal 56c and the bridge circuit 14 is formed by a solid pattern of a predetermined width or greater. Thereby, the resistance of the wiring between the output terminal 56c and the bridge circuit 14 can be minimized.

The resistor 32 and the resistor 34 are connected at the contact point b to the output terminal 58c of the error amplifier 58. The contact point b and the output terminal 58c are connected via a connector 28b. The resistor 32 and the resistor 34 are connected at the contact point b to the negative input terminal 58b of the error amplifier 58. The contact point b and the input terminal 58b are connected via a connector 28f. The negative electrode 16b of the power supply 16 is connected to the positive input terminal 58a of the error amplifier 58.

Since a voltage drop (=Vd) occurs due to the resistance of the connector 28b, the voltage at the contact point b is higher than the voltage at the output terminal 58c. The error amplifier 58 uses the voltage at the negative electrode 16b as a reference voltage and outputs, to the output terminal 58c, a voltage corresponding to the potential difference between the negative electrode 16b and the contact point b. Thereby, the voltage at the contact point b is kept at 0 V. Since the input terminal 58b of the error amplifier 58 has high impedance so that almost no current flows, the voltage drop at the connector 28f can be neglected.

The wiring between the output terminal 58c from the negative electrode 16b and the resistor 32 and the wiring between the output terminal 58c and the resistor 34 are formed so that the resistance between the output terminal 58c and the resistor 32 and the resistance between the output terminal 58c and the resistor 34 are equal to each other. Further, the wiring between the output terminal 58c and the bridge circuit 14 is formed by a solid pattern of a predetermined width or greater. Thereby, the resistance of the wiring between the output terminal 58c and the bridge circuit 14 can be minimized.

The strain gauge 12 and the resistor 32 are connected at the contact point c to the positive input terminal 38a to the instrumentation amplifier 38. The contact point c and the input terminal 38a are connected via a connector 28c. The temperature compensation gauge 30 and the resistor 34 are connected at the contact point d to the negative input terminal 38b of the instrumentation amplifier 38. The contact point d and the input terminal 38b are connected via a connector 28d. As a result, the output voltage of the bridge circuit 14 is input to the instrumentation amplifier 38.

Figure 2:
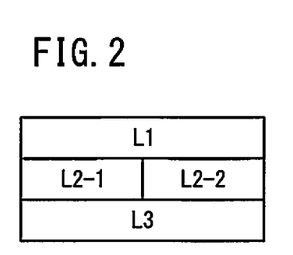
FIG. 2 is a schematic diagram showing a state in which a detecting device is multilayered.

FIG. 2 is a schematic diagram showing a multilayered state of the detecting device 10. The bridge circuit 14 is arranged in a layer L2-1 while the power supply 16 and the detection circuit 18 are disposed in the layer L2-2. The wiring between the positive electrode 16a and the bridge circuit 14 is formed in the layer L1, and the wiring between the negative electrode 16b and the bridge circuit 14 is formed in the layer L3. That is, the layer L1 including therein the wiring between the positive electrode 16a of a solid pattern and the bridge circuit 14, and the layer L3 including therein the wiring between the negative electrode 16b of a solid pattern and the bridge circuit 14 are arranged to sandwich therebetween the layer L2-1 having the bridge circuit 14 therein and the layer L2-2 having therein the power supply 16 and the detection circuit 18. As a result, it is possible to suppress noise contamination of the signals of the bridge circuit 14, the power supply 16 and the detection circuit 18 caused by external electromagnetic waves or the like.

[Calculation of Strain]

A method of calculating the strain of the measurement object in the strain calculating unit 42 will be described. A potential difference between the contact point a and the contact point b is denoted by Vb. As shown in FIG. 1, Rg denotes the resistance of the strain gauge 12, Rr denotes the resistance of the temperature compensation gauge 30, and R1 denotes the resistance of the resistor 32 and the resistor 34. Since the input terminals 38a and 38b of the instrumentation amplifier 38 have high impedance so that almost no current flows, the voltage drops at the connectors 28c and 28d can be neglected.

Assuming that the voltage input to the positive input terminal 38a of the instrumentation amplifier 38 is V+, the voltage V+ can be obtained by the following equation:

$$V+=Vb\times[R1/(Rg+R1)].$$

Assuming that the voltage input to the negative input terminal 38b of the instrumentation amplifier 38 is V−, the voltage V− can be obtained by the following equation:

$$V-=Vb\times[R1/(Rr+R1)].$$

From the above two equations, the potential difference Vs input to the instrumentation amplifier 38 is obtained by the following equation:

$$Vs = (V+) - (V-)$$
$$= Vb \times \{[R1/(Rg+R1)] - [R1/(Rr+R1)]\}.$$

The strain calculating unit 42 has a preset map indicating the relationship between the amount of strain acting on the measurement object and the value of Vs, and calculates the strain amount according to Vs. Since the resistance of the strain gauge 12 and the resistance of the temperature compensation gauge 30 are equal to each other for a strain of the measurement object caused by change in ambient temperature, Vs=0 holds when no load acts on the measurement object.

[Operation and Effect]

Configuration of Comparative Example

Figure 3:
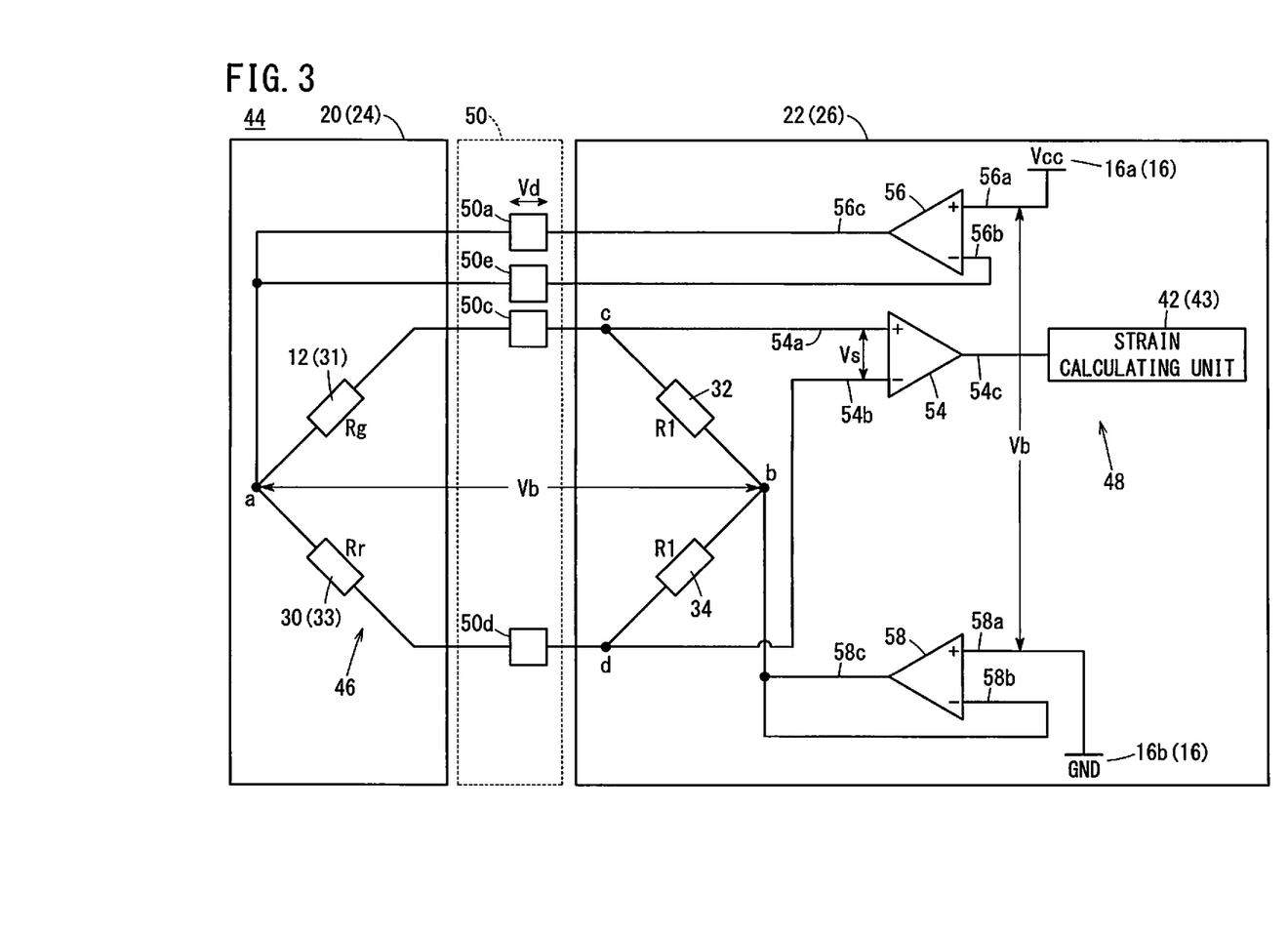
FIG. 3 is a diagram showing a circuit configuration of a detecting device of a comparative example.

FIG. 3 is a diagram showing a circuit configuration of a detecting device 44 of a comparative example. Hereinafter, the circuit configuration of the detecting device 44 will be described, but description of the same components as those in the detecting device 10 of the above embodiment will be omitted.

The detecting device 44 has a bridge circuit 46, a power supply 16 and a detection circuit 48. Of the bridge circuit 46, the strain gauge 12 and the temperature compensation gauge 30 are provided on the FPC 20, and the resistor 32 and the resistor 34 are provided on the PCB 22. The power supply 16 and the detection circuit 48 are provided on the PCB 22. The FPC 20 and the PCB 22 are connected by a connector 50.

In the detecting device 44 of the comparative example, the strain gauge 12 and the temperature compensation gauge 30 are connected at a contact point a, the resistor 32 and the resistor 34 are connected at a contact point b, the strain gauge 12 and the resistor 32 are connected at a contact point c, and the temperature compensation gauge 30 and the resistor 34 are connected at a contact point d.

The strain gauge 12 and the temperature compensation gauge 30 are connected at the contact point a to the output terminal 56c of the error amplifier 56. The contact point a and the output terminal 56c are connected via a connector 50a. The strain gauge 12 and the temperature compensation gauge 30 are connected at the contact point a to the negative input terminal 56b of the error amplifier 56. The contact point a and the input terminal 56b are connected via a connector 50e. The positive electrode 16a of the power supply 16 is connected to the positive input terminal 56a of the error amplifier 56.

The resistor 32 and the resistor 34 are connected at the contact point b to the output terminal 58c of the error amplifier 58. The contact point b and the output terminal 58c are connected via wiring on the PCB 22. The resistor 32 and the resistor 34 are connected at the contact point b of the negative input terminal 58b to the error amplifier 58. The contact point b and the input terminal 58b are connected via wiring on the PCB 22. The negative electrode 16b of the power supply 16 is connected to the positive input terminal 58a of the error amplifier 58.

The strain gauge 12 and the resistor 32 are connected at the contact point c to a positive input terminal 54a of an instrumentation amplifier 54. The strain gauge 12 and the contact point c are connected by a connector 50c. The temperature compensation gauge 30 and the resistor 34 are connected at the contact point d to a negative input terminal 54b of the instrumentation amplifier 54. The temperature compensation gauge 30 and the contact point d are connected via a connector 50d.

The detection circuit 48 includes the instrumentation amplifier 54 and the strain calculating unit 42. The instrumentation amplifier 54 has two differential input terminals (input terminals 54a, 54b) which are not high impedance, and an output terminal 54c. The instrumentation amplifier 54 amplifies the potential difference between the contact point c and the contact point d, supplied to the input terminals 54a and 54b, and outputs the resultant to the output terminal 54c.

Problems in Comparative Example

In the detecting device 44 of the comparative example, since the connectors 50c and 50d exist inside the bridge circuit 46, the resistances of the connectors 50c and 50d affect the potential difference between the contact points c and d, so that it is impossible for the strain calculating unit 42 to accurately detect the output voltage.

Operation and Effect of the Embodiment

To deal with the above, in the present embodiment, as shown in the circuit diagram of the detecting device 10 in FIG. 1, the connector 28 is arranged outside the bridge circuit 14. Further, the bridge circuit 14 and the instrumentation amplifier 38 having the high-impedance input terminals 38a and 38b are connected by the connectors 28c and 28d. Then, the output voltage of the bridge circuit 14, amplified by the instrumentation amplifier 38, is supplied to the strain calculating unit 42, so that the strain calculating unit calculates the amount of strain of the measurement object based on the output voltage. With this arrangement, almost no current flows between the bridge circuit 14 and the instrumentation amplifier 38, and hence the voltage drops at the connectors 28c and 28d can be reduced to a negligible level. As a result, the strain calculating unit 42 can accurately detect the output voltage output from the bridge circuit 14.

Further, in the present embodiment, the strain gauge 12, the temperature compensation gauge 30, the resistor 32 and the resistor 34 of the bridge circuit 14 are arranged at intervals that are each equal to or less than a predetermined distance. As a result, the strain gauge 12, the temperature compensation gauge 30, the resistor 32 and the resistor 34 can be kept at substantially the same ambient temperature. Therefore, it is possible to suppress detection errors of the output voltage of the bridge circuit 14 due to change in resistance depending on the ambient temperature. In addition, it is possible to suppress the detection error of the output voltage of the bridge circuit 14 due to the difference between the resistance of the wiring between the strain gauge 12 and the resistor 32 and the resistance of the wiring between the temperature compensation gauge 30 and the resistor 34.

Further, in the present embodiment, the wiring between the positive electrode 16a of the power supply 16 and the strain gauge 12 and the wiring between the positive electrode 16a and the temperature compensation gauge 30 are provided so that the resistance between the positive electrode 16a and the strain gauge 12 is equal to the resistance between the positive electrode 16a and the temperature compensation gauge 30. Furthermore, in the present embodiment, the wiring between the negative electrode 16b of the power supply 16 and the resistor 32 and the wiring between the negative electrode 16b and the resistor 34 are provided so that the resistance between the negative electrode 16b and the resistor 32 is equal to the resistance between the negative electrode 16b and the resistor 34. Thus, it is possible to suppress detection error of the output voltage of the bridge circuit 14 due to difference in resistance of wiring.

Further, in the present embodiment, the wiring between the positive electrode 16a of the power supply 16 and the bridge circuit 14 and the wiring between the negative electrode 16b and the bridge circuit 14 are formed with a solid pattern having a predetermined width or greater. This makes it possible to minimize the resistance of the wiring between the positive electrode 16a and the bridge circuit 14 and the resistance of the wiring between the negative electrode 16b and the bridge circuit 14. Therefore, the detection error of the output voltage of the bridge circuit 14 caused by the resistance of wiring can be suppressed.

In the present embodiment, the layer L1 in which the wiring between the positive electrode 16a of the power supply 16 and the bridge circuit 14 is disposed and the layer L3 in which the wiring between the negative electrode 16b and the bridge circuit 14 is disposed are arranged so as to sandwich the layer L2-1 having therein the bridge circuit 14. As a result, it is possible to prevent the output voltage of the bridge circuit 14 from being contaminated with noise due to external electromagnetic waves or the like.

Second Embodiment

Figure 4:
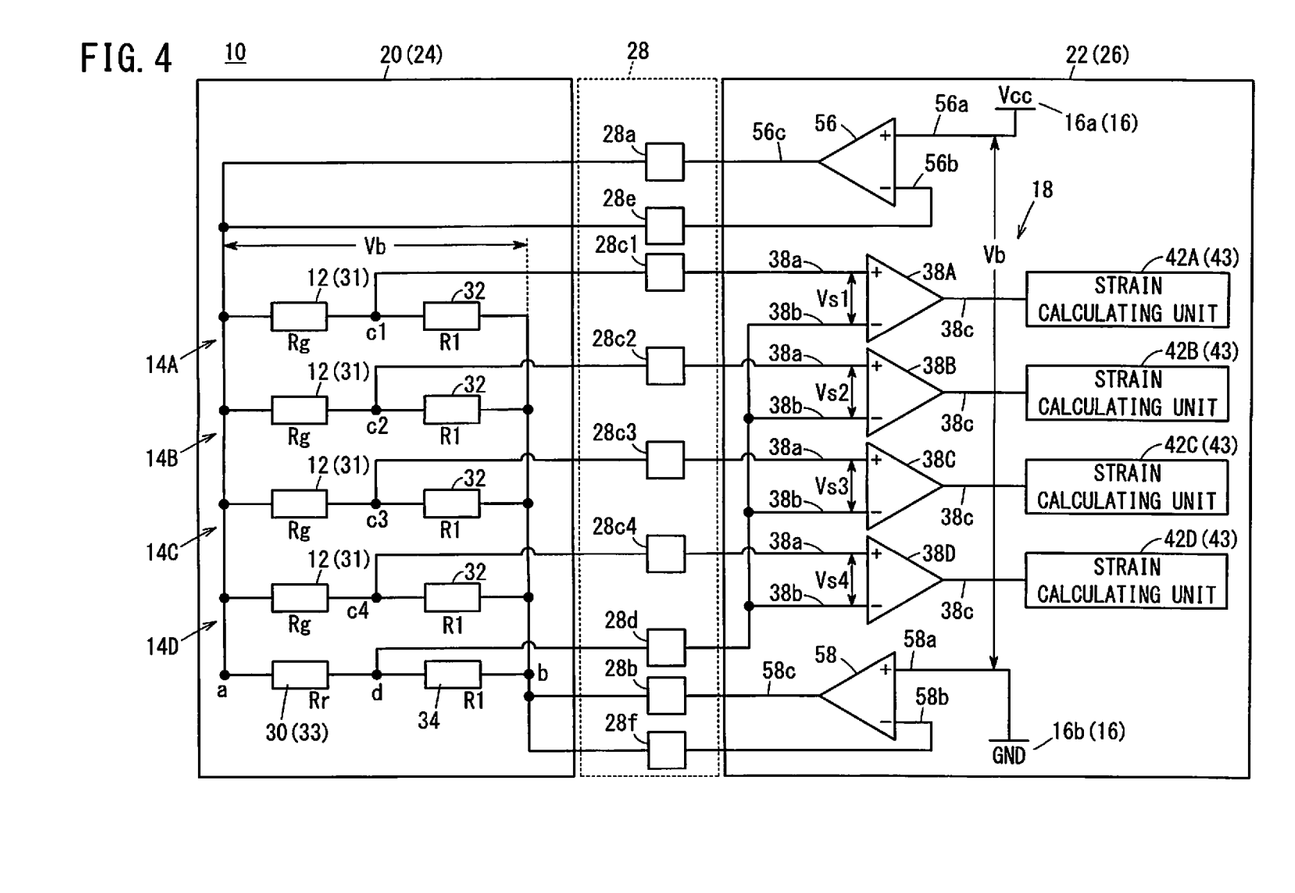
FIG. 4 is a diagram showing a circuit configuration of a detecting device according to another embodiment of the present invention.

FIG. 4 is a diagram showing a circuit configuration of a detecting device 10 of a second embodiment. In the second embodiment, four bridge circuits 14A to 14D are provided on an FPC 20. The bridge circuits 14A to 14D each have a strain gauge 12 and a resistor 32, while a temperature compensation gauge 30 and a resistor 34 are shared by the bridge circuits 14A to 14D. Also, a power supply 16 is not provided for each of the bridge circuits 14A to 14D, but is shared by the bridge circuits 14A to 14D. Hereinafter, the circuit configuration of the detecting device 10 of this embodiment will be described, but description of the same components as those of the detecting device 10 in the first embodiment will be omitted.

In the detecting device 10 of the present embodiment, the strain gauge 12 in each of the bridge circuits 14A to 14D and the shared temperature compensation gauge 30 are connected at the contact point a, and the resistor 32 in each of the bridge circuits 14A to 14D and the shared resistor 34 are connected at the contact point b. In each of the bridge circuits 14A to 14D, the strain gauge 12 and the resistor 32 are connected at the associated contact point c1 to c4. The shared temperature compensation gauge 30 and the shared resistor 34 are connected at the contact point d.

The power supply 16 is a DC power supply to supply a constant voltage (=Vb) to each of the bridge circuits 14A to 14D. In the power supply 16, error amplifiers 56 and 58 are provided on the positive electrode 16a side and the negative electrode 16b side, respectively.

The error amplifier 56 is an operational amplifier and has two high-impedance differential input terminals (input terminals 56a, 56b) and a low-impedance output terminal 56c. The error amplifier 56 amplifies the potential difference between the positive electrode 16a of the power supply 16 and the contact point a, inputted to the input terminals 56a and 56b, and outputs the amplified potential difference to the output terminal 56c. That is, the error amplifier 56 is used to form a power supply voltage feedback circuit.

The error amplifier 58 is an operational amplifier and has two high-impedance differential input terminals (input terminals 58a, 58b) and a low-impedance output terminal 58c. The error amplifier 58 amplifies the potential difference between the negative electrode 16b of the power supply 16 and the contact point b, inputted to the input terminals 58a and 58b, and outputs the amplified potential difference to the output terminal 58c. That is, the error amplifier 58 is used to constitute a power supply voltage feedback circuit.

The detection circuit 18 includes instrumentation amplifiers 38A to 38D and strain calculating units 42A to 42D. The instrumentation amplifiers 38A to 38D each have two high-impedance differential input terminals (input terminals 38a and 38b) and a low-impedance output terminal 38c. Each of the instrumentation amplifiers 38A to 38D amplifies the potential difference between the associated contact point c and the contact point d, supplied to the input terminals 38a and 38b, and outputs the amplified potential difference to the output terminal 38c. The strain calculating units 42A to 42D receive the potential differences amplified by the instrumentation amplifiers 38A to 38D and calculate the strains acting on the measurement objects, respectively.

The strain gauge 12 in each of the bridge circuits 14A to 14D and the shared temperature compensation gauge 30 are connected at the contact point a to the output terminal 56c of the error amplifier 56. The contact point a and the output terminal 56c are connected via a connector 28a. Each strain gauge 12 in the bridge circuits 14A to 14D and the shared temperature compensation gauge 30 are connected at the contact point a to the negative input terminal 56b of the error amplifier 56. The contact point a and the input terminal 56b are connected via a connector 28e. The positive electrode 16a of the power supply 16 is connected to the positive input terminal 56a of the error amplifier 56.

The resistor 32 in each of the bridge circuits 14A to 14D and the common resistor 34 are connected at the contact point b to the output terminal 58c of the error amplifier 58. The contact point b and the output terminal 58c are connected via a connector 28b. Each resistor 32 and the resistor 34 are connected at the contact point b to the negative input terminal 58b of the error amplifier 58. The contact point b and the input terminal 58b are connected via a connector 28f. The negative electrode 16b of the power supply 16 is connected to the positive input terminal 58a of the error amplifier 58.

The strain gauge 12 in each of the bridge circuits 14A to 14D and the resistor 32 in each of the bridge circuits 14A to 14D are connected at the associated one of the contact points c1 to c4 to the positive input terminal 38a of the associated one of the instrumentation amplifiers 38A to 38D. The contact points c1 to c4 and the input terminals 38a are connected via the connectors 28c1 to 28c4, respectively. The shared temperature compensation gauge 30 and the shared resistor 34 are connected at the contact point d to the negative input terminals 38b of the instrumentation amplifiers 38A to 38D. The contact point d and the input terminals 38b are connected via a connector 28d. Thus, the output voltages from the bridge circuits 14A to 14D are input to the instrumentation amplifiers 38A to 38D, respectively.

The potential differences Vs1 to Vs4 input to the instrumentation amplifiers 38A to 38D can be determined by the same method as that described in the first embodiment to determine the potential difference Vs input to the instrumentation amplifier 38.

[Operation and Effect]

In this embodiment, the detecting device 10 has a plurality of (four) bridge circuits 14A to 14D, and the power supply 16 is shared by the bridge circuits 14A to 14D. Thereby, it is possible to downsize the detecting device 10 and suppress the manufacturing cost.

Further, in the present embodiment, the temperature compensation gauge 30 is shared by the bridge circuits 14A to 14D. Thereby, it is possible to downsize the detecting device 10 and suppress the manufacturing cost.

[Modifications]

Figure 5:
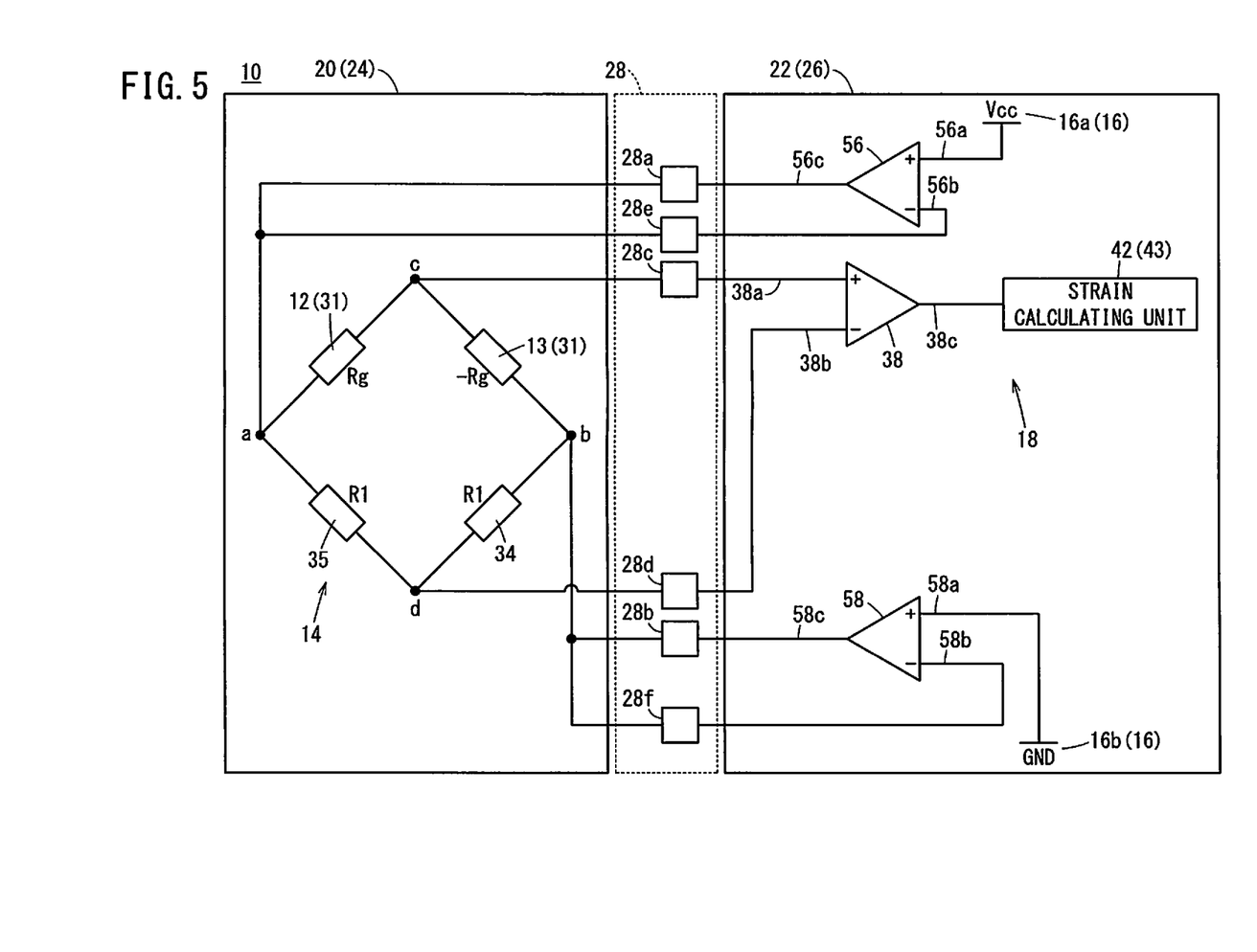
FIG. 5 is a diagram showing a circuit configuration of a detecting device according to a modification.

FIG. 5 is a diagram showing a circuit configuration of a detecting device 10 according to a modification. As shown in FIG. 5, the resistor 32 in the first embodiment (see FIG. 1) may be replaced with another strain gauge 13 which is bonded so as to oppose the strain gauge 12, so that the resistance of the strain gauge 13 varies in a manner opposite to that of the strain gauge 12. In this case, change in temperature due to the expansion or deformation of the strain generating body can be canceled because the strain gauge 12 and the strain gauge 13 are arranged so as to oppose each other. Consequently, the temperature compensation gauge 30 arranged in the first embodiment is no longer necessary, and can be replaced by a resistor 35, which is a fixed resistor like the resistors 32 and 34. In this case, the strain gauge 13 also constitutes a sensing resistor 31. That is, the bridge circuit 14 has two strain gauges 12 and 13.

Figure 6:
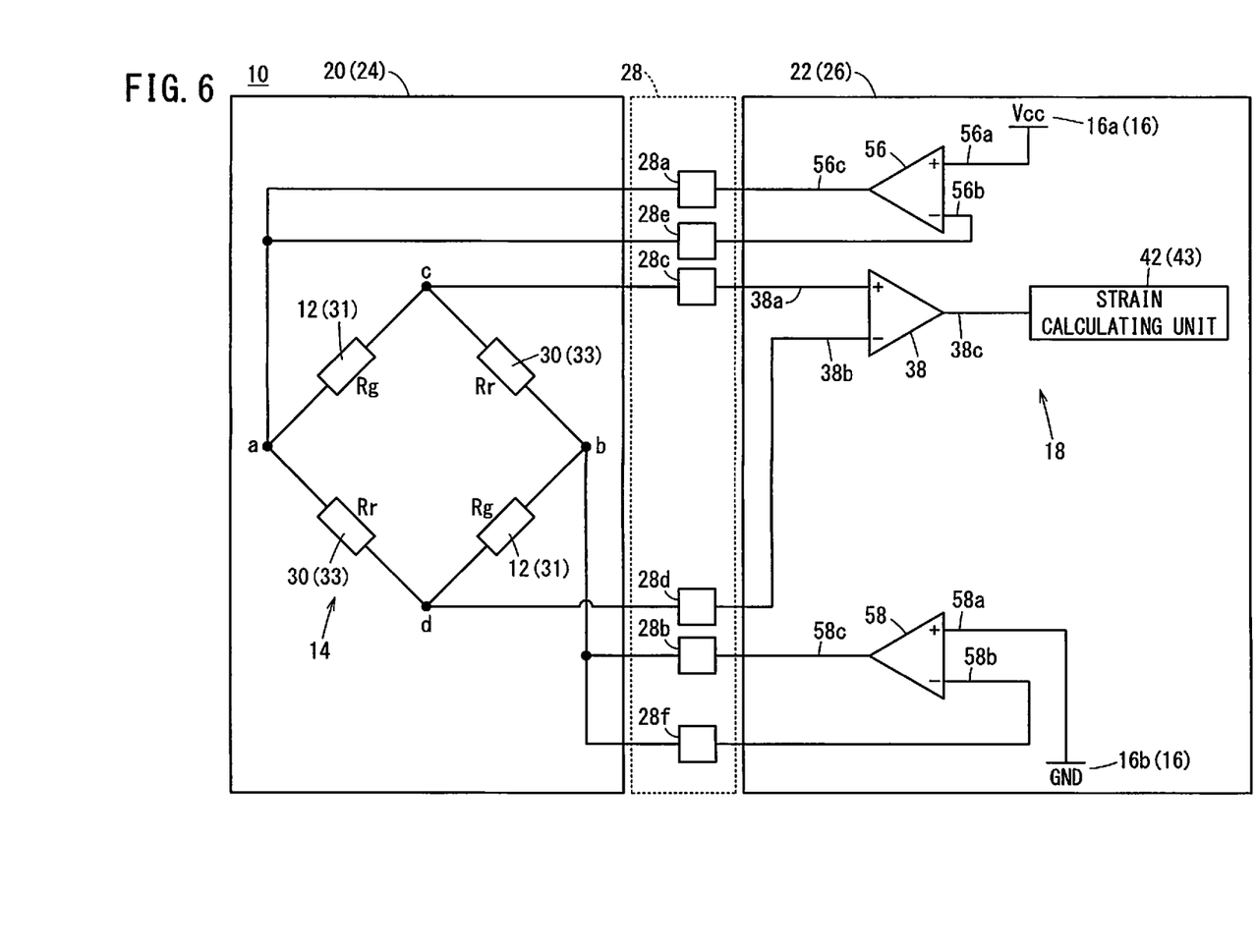
FIG. 6 is a diagram showing a circuit configuration of a detecting device according to another modification.

FIG. 6 is a diagram showing a circuit configuration of the detecting device 10 of another modification. As shown in FIG. 6, another strain gauge 12 may be disposed at the position of the resistor 34 in the first embodiment (see FIG. 1), in place of the resistor 34, and another temperature compensation gauge 30 may be disposed at the position of the resistor 32 in the first embodiment (see FIG. 1), in place of the resistor 32. In this case, the bridge circuit 14 includes two strain gauges 12 and two temperature compensation gauges 30.

Figure 7:
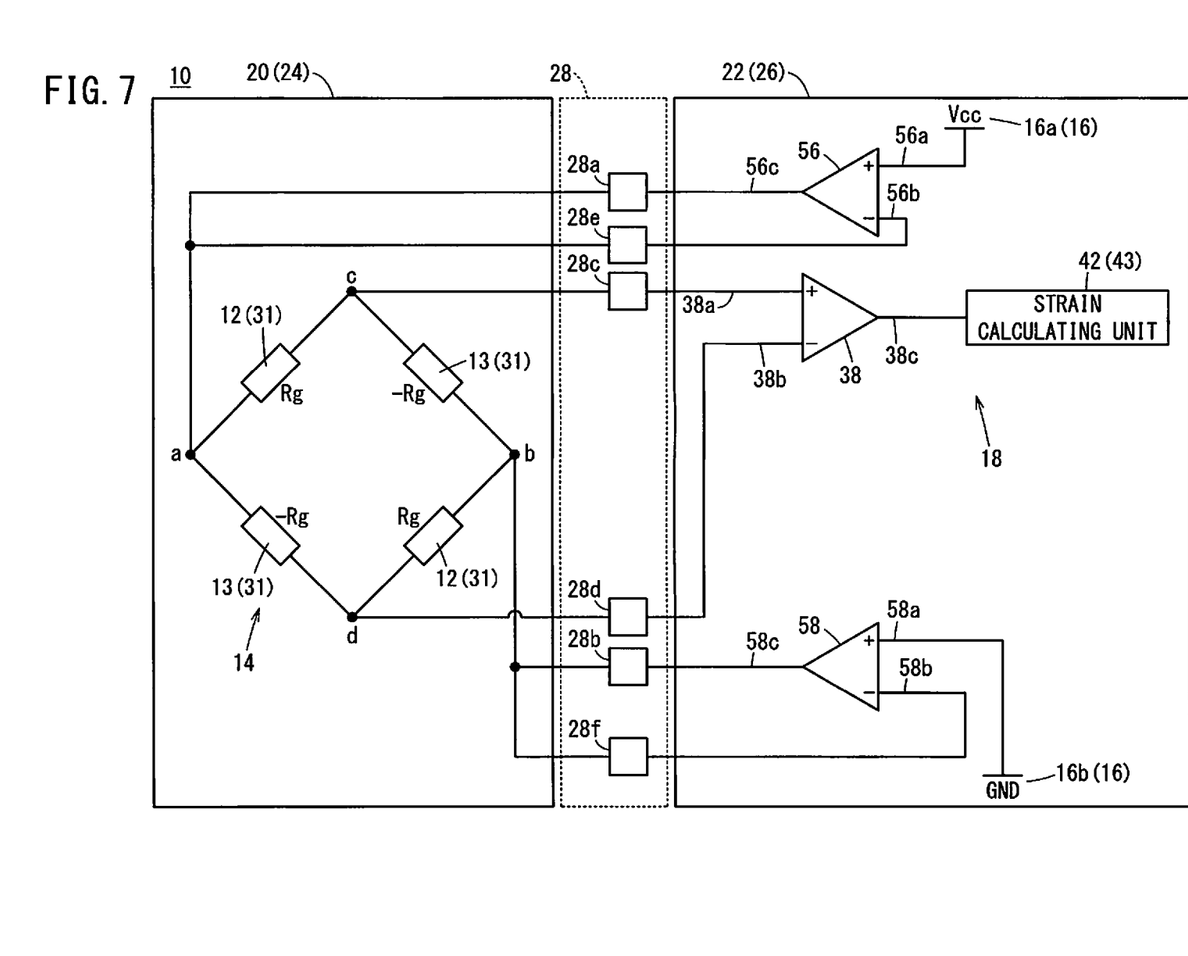
FIG. 7 is a diagram showing a circuit configuration of a detecting device according to another modification.

FIG. 7 is a diagram showing a circuit configuration of a detecting device 10 according to a further modification. As shown in FIG. 7, another strain gauge 12 may be arranged at the position of the resistor 34 of the first embodiment (see FIG. 1), in place of the resistor 34, while the temperature compensation gauge 30 and the resistor 32 of the first embodiment (see FIG. 1) each may be replaced with another strain gauge 13 which is bonded so as to oppose the associated strain gauge 12 so that the resistance of the strain gauge 13 varies in a manner opposite to that of the strain gauge 12. In this case, the bridge circuit 14 has four strain gauges 12 and 13, in total.

Figure 8:
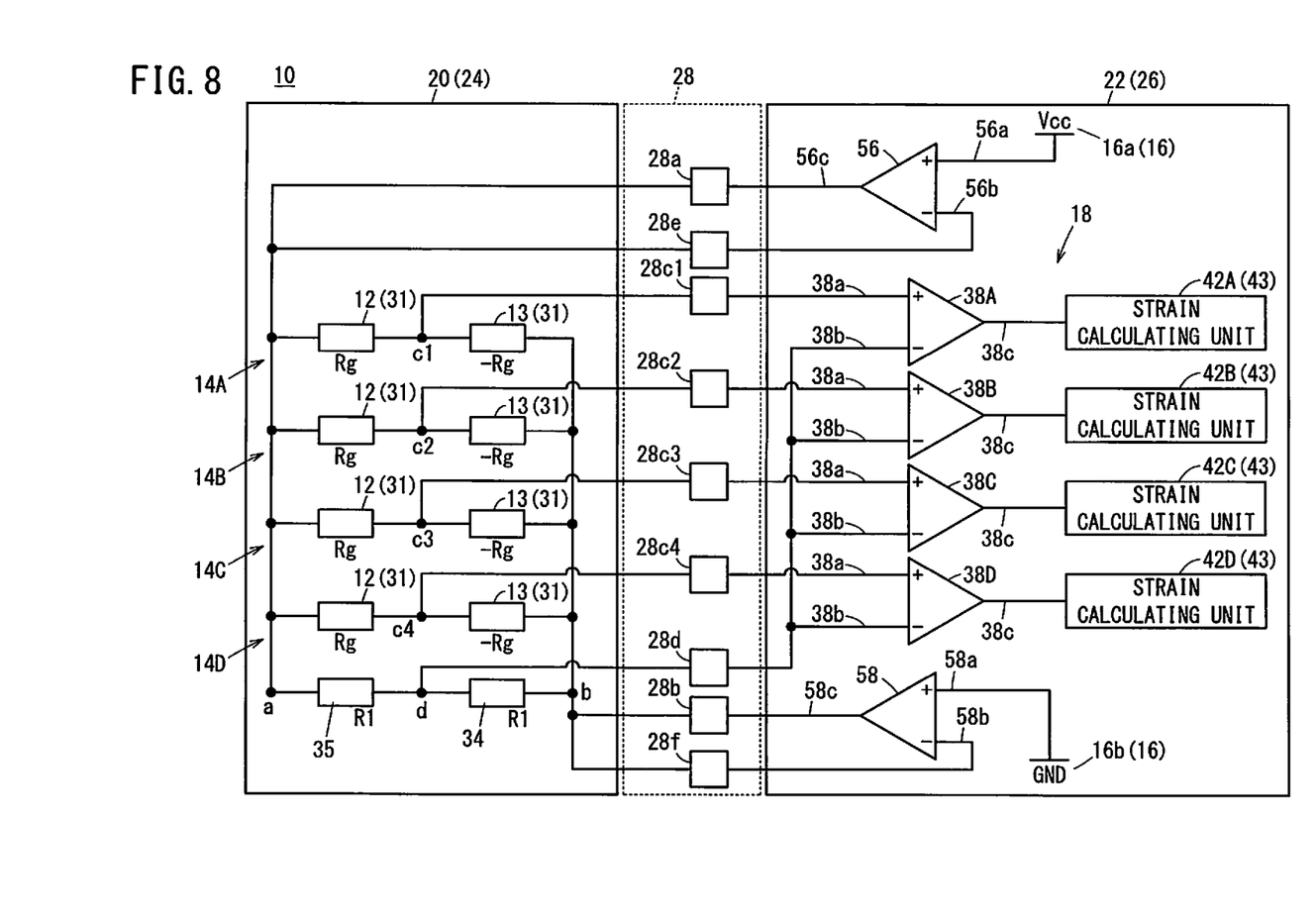
FIG. 8 is a diagram showing a circuit configuration of a detecting device according to another modification.

FIG. 8 is a diagram showing a circuit configuration of a detecting device 10 according to still another modification. As shown in FIG. 8, each of the resistors 32 of the second embodiment (see FIG. 4) may be replaced with another strain gauge 13 which is bonded so as to oppose the associated strain gauge 12 so that the resistance of the strain gauge 13 varies in a manner opposite to that of the strain gauge 12. In this case, change in temperature due to the expansion or deformation of the strain generating body can be canceled because the strain gauge 12 and the strain gauge 13 are arranged so as to oppose each other. As a result, the temperature compensation gauges 30 arranged in the second embodiment are no longer necessary and can be replaced by resistors 35, which are a fixed resistor like the resistors 32 and 34. In this case, each of the bridge circuits 14A to 14D has two strain gauges 12 and 13.

Technical Concepts Obtained from Embodiments

Technical concepts that can be grasped from the above embodiments will be described below.

A detecting device (10) includes: a bridge circuit (14, 14A to 14D) having a plurality of resistors (31 to 35) including at least one sensing resistor (31) whose resistance varies according to a physical quantity of a measurement object; a power supply (16) configured to apply a voltage to the bridge circuit (14, 14A to 14D); an amplifier (38, 38A to 38D) having high-impedance input terminals (38a, 38b) and configured to receive an output voltage of the bridge circuit (14, 14A to 14D) from the input terminals (38a, 38b), amplify the received output voltage and output the amplified output voltage; a physical quantity calculating unit (43) configured to receive the output voltage amplified by the amplifier (38, 38A to 38D) and calculate the physical quantity based on the output voltage; a first substrate (24) on which the bridge circuit (14, 14A to 14D) is provided; and a second substrate (26) on which the amplifier (38, 38A to 38D) is provided. In this configuration, the bridge circuit (14, 14A to 14D) is connected to the amplifier (38, 38A to 38D) via a connector (28). As a result, since the voltage drop at the connector (28) can be reduced to a negligible level, the physical quantity calculating unit (43) can accurately detect the output voltage outputted from the bridge circuit (14, 14A to 14D).

In the above detecting device (10), the plurality of resistors (31 to 35) in the bridge circuit (14, 14A to 14D) may be arranged at intervals that are equal to or less than a predetermined distance. This configuration makes it possible to keep all the resistors (31 to 35) at substantially the same ambient temperature, so that it is possible to suppress detection error of the output voltage of the bridge circuit (14, 14A to 14D) due to change in resistance depending on the ambient temperature. In addition, the detection error of the output voltage of the bridge circuit (14, 14A to 14D) due to difference in resistance of the wiring between the resistors (31 to 35) can be suppressed.

In the detecting device (10), wiring between the power supply (16) and the resistors (31, 32, 33, 34) may be arranged so that resistance between the negative electrode (16b) of the power supply (16) and each of the resistors (31, 32, 33, 34) connected to the negative electrode (16b) is equal to each other. This makes it possible to suppress the detection error of the output voltage of the bridge circuit (14, 14A to 14D) due to difference in resistance of wiring.

In the detecting device (10), wiring between the power supply (16) and the resistors (31, 33, 35) may be arranged so that resistance between the positive electrode (16a) of the power supply (16) and each of the resistors (31, 33, 35) connected to the positive electrode (16a) is equal to each other. This makes it possible to suppress the detection error of the output voltage of the bridge circuit (14, 14A to 14D) due to difference in resistance of wiring.

In the detecting device (10), wiring between the negative electrode (16b) of the power supply (16) and the bridge circuit (14, 14A to 14D) may be formed of a solid pattern having a predetermined width or greater. Thus, it is possible to suppress the detection error of the output voltage of the bridge circuit (14, 14A to 14D) due to resistance of wiring.

In the detecting device (10), wiring between the positive electrode (16a) of the power supply (16) and the bridge circuit (14, 14A to 14D) may be formed of a solid pattern having a predetermined width or greater. Thus, it is possible to suppress the detection error of the output voltage of the bridge circuit (14, 14A to 14D) due to resistance of wiring.

The detecting device (10) may further include: a first layer (L1) provided with wiring between the positive electrode (16a) of the power supply (16) and each of the resistors (31, 33, 35) connected to the positive electrode (16a) of the power supply (16); and a second layer (L2-1) provided with the bridge circuit (14, 14A to 14D), and the first layer (L1) and the second layer (L2-1) may be stacked together. This configuration can suppress noise contamination of the output voltage of the bridge circuit (14, 14A to 14D) due to external electromagnetic waves or the like.

The detecting device (10) may further include: a second layer (L2-1) provided with the bridge circuit (14, 14A to 14D); and a third layer (L3) provided with wiring between the negative electrode (16b) of the power supply (16) and each of the resistors (31, 32, 33, 34) connected to the negative electrode (16b) of the power supply (16), and the second layer (L2-1) and the third layer (L3) may be stacked together. This configuration prevents the output voltage of the bridge circuit (14, 14A to 14D) from being contaminated with noise due to external electromagnetic waves or the like.

The detecting device (10) may further include: a first layer (L1) provided with wiring between the positive electrode (16a) of the power supply (16) and each of the resistors (31, 33, 35) connected to the positive electrode (16a) of the power supply (16); a second layer (L2-1) provided with the bridge circuit (14, 14A to 14D); and a third layer (L3) provided with wiring between the negative electrode (16b) of the power supply (16) and each of the resistors (31, 32, 33, 34) connected to the negative electrode (16b) of the power supply (16), and the second layer (L2-1) may be sandwiched between the first layer (L1) and the third layer (L3). This configuration suppresses noise contamination of the output voltage of the bridge circuit (14, 14A to 14D) due to external electromagnetic waves or the like.

In the detecting device (10), the plurality of bridge circuits (14A to 14D) may be provided, and the power supply (16) may be shared by the plurality of bridge circuits (14A to 14D). Thereby, it is possible to downsize the detecting device (10) and suppress the manufacturing cost.

In the detecting device (10), the plurality of bridge circuits (14A to 14D) may be provided, and the resistance of the sensing resistor (31) may vary depending on a target physical quantity of the measurement object and a physical quantity other than the target physical quantity. Further, the bridge circuit (14A to 14D) may include a reference resistor (33) whose resistance varies depending on the physical quantity other than the target physical quantity of the measurement object, and the reference resistor (33) may be shared by the plurality of bridge circuits (14A to 14D). Thereby, it is possible to downsize the detecting device (10) and suppress the manufacturing cost.

The present invention is not particularly limited to the embodiments described above, and various modifications are possible without departing from the essence and gist of the present invention.

What is claimed is:

1. A detecting device comprising:
   a bridge circuit having a plurality of resistors including at least one sensing resistor whose resistance varies according to a physical quantity of a measurement object;
   a power supply configured to apply a voltage to the bridge circuit;
   an amplifier having input terminals and configured to receive an output voltage of the bridge circuit from the input terminals, amplify the received output voltage and output the amplified output voltage;
   a physical quantity calculating unit configured to receive the output voltage amplified by the amplifier and calculate the physical quantity based on the output voltage;
   a first substrate on which the bridge circuit is provided;
   a second substrate on which the amplifier is provided,
   wherein the bridge circuit is connected to the amplifier via a connector;

a first layer provided with wiring between a positive electrode of the power supply and each of the resistors connected to the positive electrode of the power supply;
a second layer provided with the bridge circuit; and
a third layer provided with wiring between a negative electrode of the power supply and each of the resistors connected to the negative electrode of the power supply, wherein the second layer is sandwiched between the first layer and the third layer.

2. The detecting device according to claim 1, wherein the plurality of resistors in the bridge circuit are arranged at intervals that are equal to or less than a predetermined distance.

3. The detecting device according to claim 1, wherein the wiring between the negative electrode of the power supply and the resistors is arranged so that resistance between the negative electrode of the power supply and each of the resistors connected to the negative electrode is equal to each other.

4. The detecting device according to claim 1, wherein the wiring between the positive electrode of the power supply and the resistors is arranged so that resistance between the positive electrode of the power supply and each of the resistors connected to the positive electrode is equal to each other.

5. The detecting device according to claim 1, wherein the wiring between the negative electrode of the power supply and the bridge circuit is formed of a solid pattern having a predetermined width or greater.

6. The detecting device according to claim 1, wherein the wiring between the positive electrode of the power supply and the bridge circuit is formed of a solid pattern having a predetermined width or greater.

7. The detecting device according to claim 1, wherein:
the bridge circuit comprises a plurality of bridge circuits; and
the power supply is shared by the plurality of bridge circuits.

8. The detecting device according to claim 1, wherein:
the bridge circuit comprises a plurality of bridge circuits;
the resistance of the sensing resistor varies depending on a target physical quantity of the measurement object and a physical quantity other than the target physical quantity;
the bridge circuit includes a reference resistor whose resistance varies depending on the physical quantity other than the target physical quantity of the measurement object; and
the reference resistor is shared by the plurality of bridge circuits.

\* \* \* \* \*